US010512199B2

(12) United States Patent
Hirasawa et al.

(10) Patent No.: US 10,512,199 B2
(45) Date of Patent: Dec. 17, 2019

(54) POWER CONVERSION APPARATUS PROVIDED WITH SEMICONDUCTOR MODULE AND ELECTRONIC COMPONENT PRESSURIZED BY PRESSURIZING MEMBER

(71) Applicants: DENSO CORPORATION, Kariya, Aichi-pref. (JP); TOKIN CORPORATION, Sendai, Miyagi (JP)

(72) Inventors: Naoki Hirasawa, Nihio (JP); Ryota Tanabe, Kariya (JP); Takashi Kawashima, Kariya (JP); Takashi Yanbe, Sendai (JP); Masahiro Kondou, Sendai (JP)

(73) Assignees: DENSO CORPORATION, Kariya (JP); TOKIN CORPORATION, Sendai (JP)

( * ) Notice: Subject to any disclaimer, the term of this patent is extended or adjusted under 35 U.S.C. 154(b) by 0 days.

(21) Appl. No.: 15/695,825

(22) Filed: Sep. 5, 2017

(65) Prior Publication Data

US 2018/0070480 A1 Mar. 8, 2018

(30) Foreign Application Priority Data

Sep. 5, 2016 (JP) ................................ 2016-172982

(51) Int. Cl.
*H05K 7/20* (2006.01)
*H01L 23/473* (2006.01)
*B60L 15/00* (2006.01)

(52) U.S. Cl.
CPC ........ *H05K 7/20927* (2013.01); *B60L 15/007* (2013.01); *H01L 23/473* (2013.01); *H05K 7/20263* (2013.01); *H05K 7/20854* (2013.01); *B60L 2210/10* (2013.01); *B60L 2270/142* (2013.01); *B60L 2270/145* (2013.01)

(58) Field of Classification Search
CPC .............. H01L 23/473; H05K 7/20854; H05K 7/20263; H05K 7/20927; B60L 2210/10; B60L 15/007; B60L 2270/142; B60L 2270/145
See application file for complete search history.

(56) References Cited

FOREIGN PATENT DOCUMENTS

JP 5126136 B2 * 1/2013
JP 2014146631 A * 8/2014

* cited by examiner

*Primary Examiner* — Mukundbhai G Patel
*Assistant Examiner* — Zhengfu J Feng
(74) *Attorney, Agent, or Firm* — Oliff PLC

(57) ABSTRACT

A power conversion apparatus includes: a semiconductor module, an electronic component, a plurality of cooling pipes and a casing that accommodates the semiconductor module, the electronic component and the cooling pipes. An abutting surface is provided at a part of the casing, in which the electronic component comes into contact with the abutting surface. A pressurizing member pressurizes the semiconductor module in a first direction extending from the semiconductor module to the electronic component. The electronic component includes a part body and a wing portion and the wing portion protrudes from the part body at least either one side of both sides thereof with respect to a second direction perpendicular to the first direction, and comes into contact with the abutting surface from a semiconductor module side with respect to the first direction.

8 Claims, 14 Drawing Sheets

62
61
2
412
4
422
421
40
8
30
3
321
32
301
311
31
33
7
525
524
Z
X
Y
5

422
421
521
525
524
62
3(30)
301
7
8
4
32
412
70
311
31
33
12
2
523
11
411
40
61
522
(52)5
1
X
Y

POWER CONVERSION APPARATUS PROVIDED WITH SEMICONDUCTOR MODULE AND ELECTRONIC COMPONENT PRESSURIZED BY PRESSURIZING MEMBER

CROSS-REFERENCE TO RELATED APPLICATION

This application is based on and claims the benefit of priority from earlier Japanese Patent Application No. 2016-172982 filed Sep. 5, 2016, the description of which is incorporated herein by reference.

BACKGROUND OF THE INVENTION

Technical Field

The present disclosure relates to power conversion apparatuses.

Description of Related Art

As a power conversion apparatus, Japanese Patent No. 5126136 discloses a laminate in which semiconductor modules and a reactor are stacked together with a plurality of cooling pipes. In the power conversion apparatus, a compression spring is used to pressure the laminate of the semiconductor modules and the reactor in the laminate direction. Thus, the laminate configuration reduces a thermal resistance between the semiconductor modules and the cooling pipes and a thermal resistance between the reactor and the cooling pipes. According to the above-mentioned power conversion apparatus, the reactor is fixed to a housing case by bolts, but being slidable in the laminate direction when being mounted to the housing case in order to improve its mountability.

However, a following problem is present in the above-described power conversion apparatus. Specifically, in order to improve cooling efficiency of the semiconductor modules, a contact pressure between the semiconductor modules and the cooling pipes is required to be increased. In this respect, an effective way to increase the contact pressure, a pressurizing force of the compression spring can be increased.

However, when increasing the pressurizing force of the compression spring, a large load is applied to the reactor in the laminate direction as well. In the case where the load overcomes a fixing force of the reactor to the housing case, the reactor is shifted in the laminate direction with respect to the housing case. Hence, the dimension defined by the semiconductor modules and the cooling pipes in the laminate direction is increased so that a designed cooling performance of the semiconductor modules cannot be achieved. Accordingly, as a countermeasure, the number of bolts has to be increased to make the fixing force of the reactor to the housing case sufficiently overcome the above-mentioned load. Thus, there is a concern that the number of components may be increased and the size of the power conversion apparatus may be increased.

Also, it is required that the reactor itself overcomes a large load. As a result, the size of the reactor may be increased and the size of the power conversion apparatus may be increased as well. On the other hand, such a large cooling performance of the semiconductor module is not required for the reactor. Similarly, electronic components such as capacitors have the same circumstance as described above.

SUMMARY

The present disclosure has been achieved in light of the above-described circumstances and provides a power conversion apparatus capable of improving the cooling effect of the semiconductor module and reducing the size of the apparatus.

As an aspect of the present disclosure, a power conversion apparatus includes: a semiconductor module that integrates a semiconductor element;

an electronic component electrically connected to the semiconductor module; a plurality of cooling pipes that cool the semiconductor module and the electronic component, the cooling pipes being disposed to sandwich both sides of the semiconductor module and the electronic component; a casing that accommodates the semiconductor module, the electronic component and the cooling pipes, an abutting surface being provided at a part of the casing, wherein the electronic component comes into contact with the abutting surface;

a semiconductor section including the semiconductor module and the cooling pipes arranged therein; an electronic component section including the electronic component and the cooling pipes; and a pressurizing member that pressurizes the semiconductor section in a first direction, the first direction extending from the semiconductor module to the electronic component section. The semiconductor section and the electronic component section are arranged to be adjacent to each other, the electronic component includes a part body and a wing portion and the wing portion protrudes from the part body at least either one side of both sides thereof with respect to a second direction as a horizontal direction which is perpendicular to the first direction, and comes into contact with the abutting surface from a semiconductor section side with respect to the first direction.

According to the above-described power conversion apparatus, the electronic component includes a pair of wing portions. The pair of wing portions each protrudes from both side in the horizontal direction from the part body, and comes into contact with an abutting surface provided at a part of the casing, from the first direction where the semiconductor modules are laminated. Hence, pressurizing force of the pressurizing member being applied to the semiconductor section can be accepted by the abutting surface of the casing via the wing portion. Thus, even if the pressuring force of the pressurizing member is set to be larger, the electronic component can be prevented from being shifted in the first direction (laminate direction). Accordingly, the contact pressure between the semiconductor modules and the cooling pipes in the semiconductor section can be sufficiently secured. As a result, the cooling efficiency of the semiconductor modules can be improved.

Also, the pressurizing force of the pressurizing member is propagated to the electronic component via the semiconductor section. However, the pressurizing force from the semiconductor section side only effects to a portion of the electronic component located between a surface of the semiconductor section side and the wing portion so that a large load applied to the electronic component is suppressed. Therefore, a withstand load of the electronic component does not has to be increased, and the size of the electronic component does not have to be larger as well.

At least a part of the wing portion is disposed, with respect to the third direction (i.e., height direction) perpendicular to both of the first and second directions, to overlap the connection pipe in the electronic component section. Therefore, it is not necessary to secure a new space in the casing in order to have the wing portion contact the abutting surface. Therefore, the power conversion apparatus can be shrunk.

As described, according to the above-mentioned aspects, a power conversion apparatus can be provided capable of improving the cooling effect of the semiconductor module and reducing the apparatus.

It should be noted that the bracketed reference signs of individual means in this column and in the claims indicate correspondence to specific means in the embodiments described later, and do not limit the technical scope of the present disclosure.

DETAILED DESCRIPTION OF THE PREFERRED EMBODIMENTS

First Embodiment

Hereinafter, with reference to the drawings, embodiments of the above-described power conversion apparatus will be described.

Figure 1:
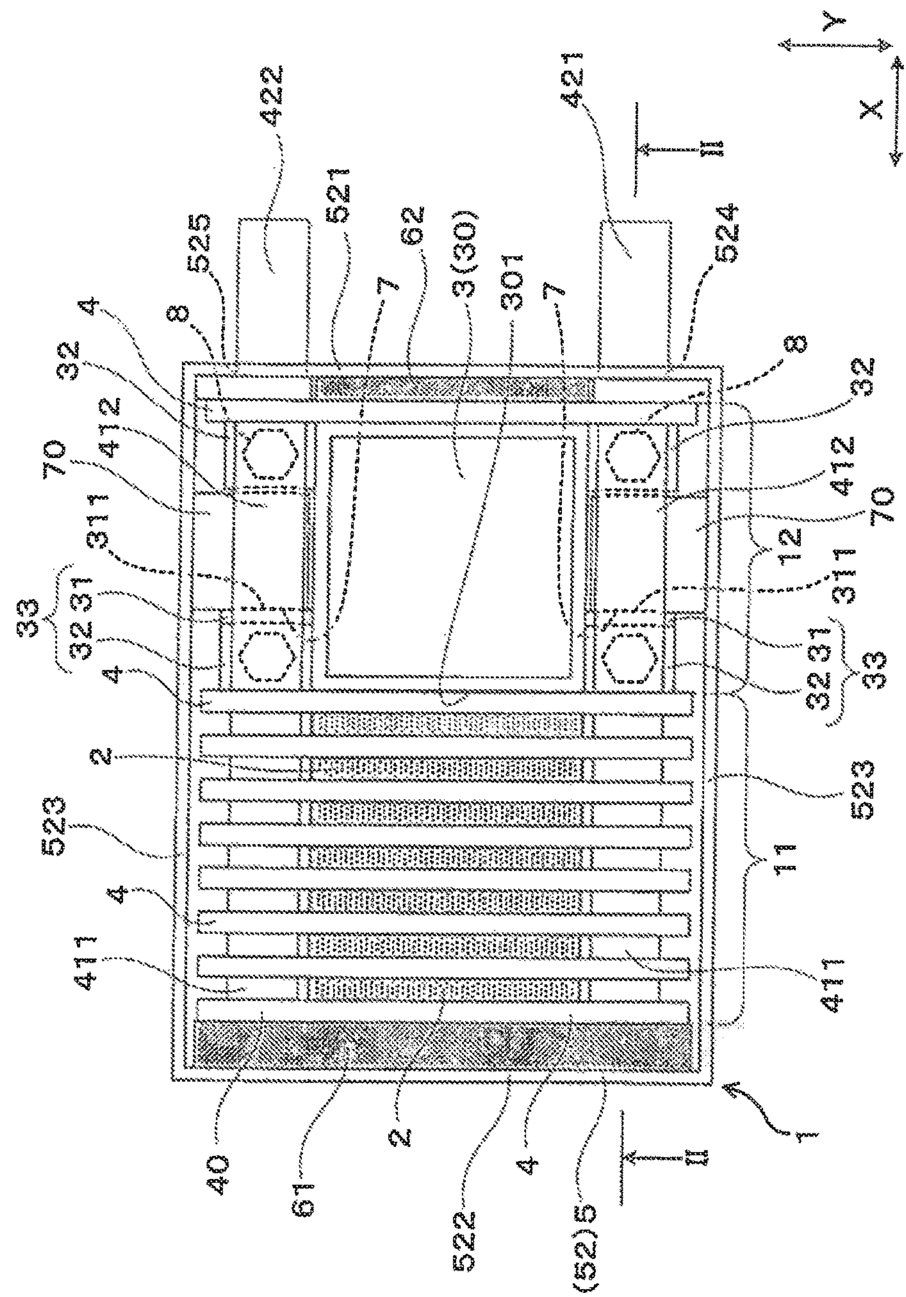
FIG. 1 is a plan view showing a power conversion apparatus according to a first embodiment of the present disclosure.
Figure 2:
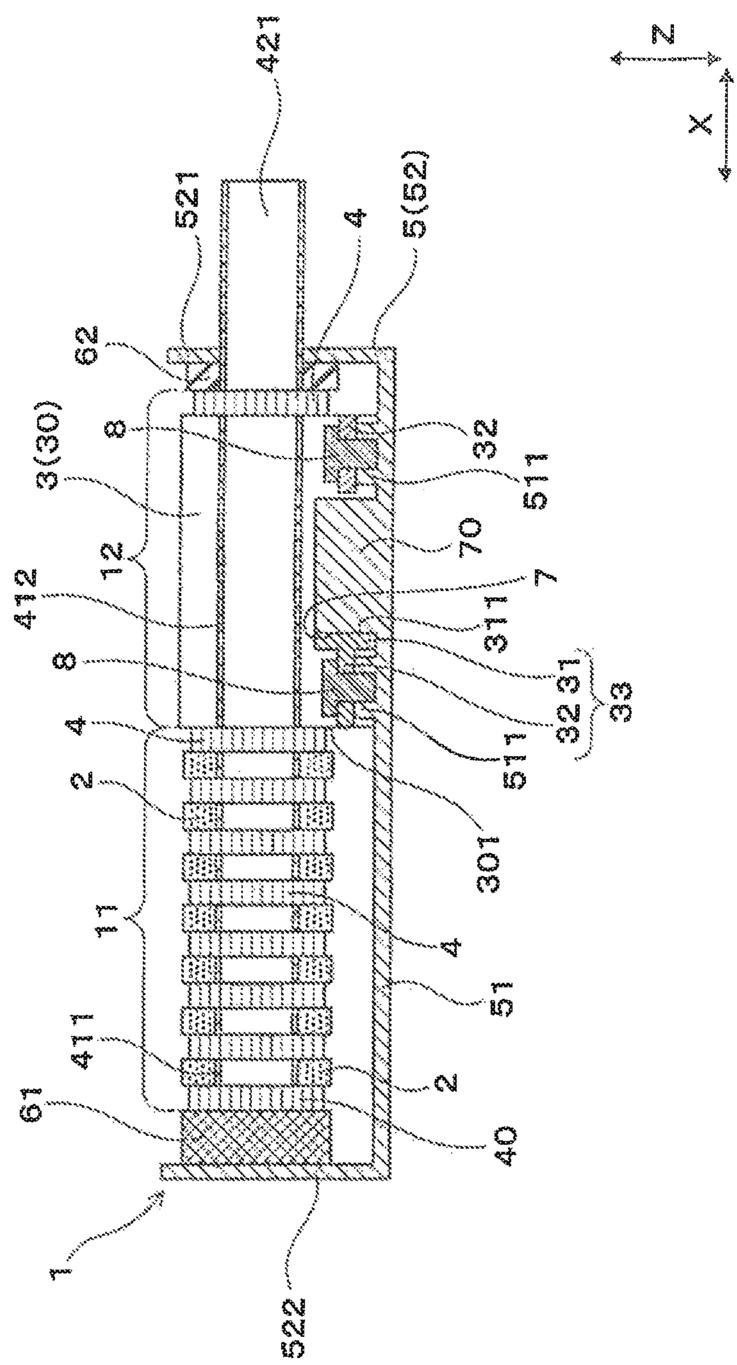
FIG. 2 is a cross-sectional view sectioned along a line II-II shown in FIG. 1.

As shown in FIGS. 1 and 2, a power conversion apparatus according to the first embodiment is provided with semiconductor modules 2, a reactor 3 as an electronic component, a plurality of cooling pipes 4, a casing 5, a main pressurizing member 61, and a sub pressurizing member 62.

The semiconductor modules 2 each integrates a semiconductor element. The reactor 3 is an electronic component electrically connected to the semiconductor modules 2. The plurality of cooling pipes 4 sandwich both sides of the semiconductor modules 2 and the reactor 3 and cool them from the both sides. The casing 5 accommodates the semiconductor modules 2, the reactor 3 and the cooling pipes 4. The main pressurizing member 61 pressurizes in a stack direction X, a semiconductor stack 11 (i.e., semiconductor section) in which the semiconductor modules 2 and the cooling pipes 4 are stacked. The sub pressurizing member 62 pressurizes in a stack direction X, a component stack 12 (i.e., electronic component section) in which the reactor 3 and the cooling pipes 4 are stacked, in the stack direction X (i.e., first direction).

The semiconductor stack 11 and the component stack 12 are linearly stacked. The pressurizing force of the main pressurizing member 61 Is larger than that of the sub pressurizing member 62. The main pressurizing member 61 is disposed at an end portion of the semiconductor stack 11, the end portion being positioned in a far side from the component stack 12. In the power conversion apparatus 1 according to the first embodiment, a side in which the main pressurizing member 61 is disposed is referred to as a rear side and the opposite side is referred to as a front side. The expressions "front" and "rear" sides are used for convenience only, and do not limit the arrangement of the power conversion apparatus 1.

The cooling pipe 4 has a shape of which the longitudinal side extends in the horizontal direction Y (i.e., second direction). The horizontal direction Y is one of directions perpendicular to the laminate direction. Mutually adjacent cooling pipes 4 in the laminate direction X are connected by connection pipes 411 and 412 at both ends of the cooling pipes 4 with respect to the horizontal direction Y.

The reactor 3 has a reactor body 30 as a part body and a pair of wing portion 31. Each of the pair of wing portion 31 is protruded in the horizontal direction Y from the reactor body 30, and comes into contact, from the rear side which is a semiconductor stack 11 side with respect to the laminate direction X, with an abutting surface 7 provided in a part of the casing 5. At least a part of the wing portion 31 is arranged in a position overlapping the connection pipe 412 in the component stack 12, with respect to a height direction Z (i.e., third direction) that orthogonally crosses both X and Y directions.

Figure 3:
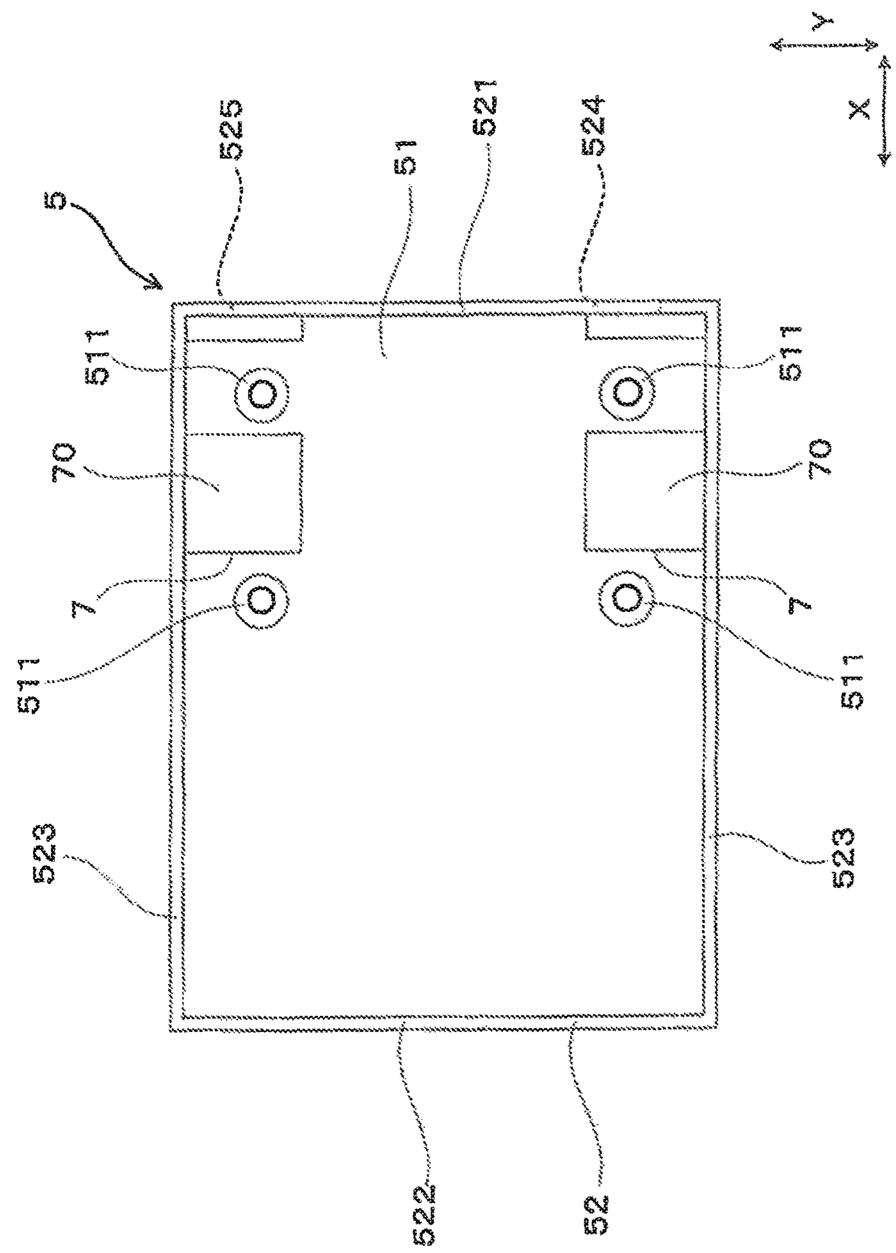
FIG. 3 is a plan view showing a casing according to the first embodiment.

The power conversion apparatus 1 according to the first embodiment can be configured of an inverter mounted on an electric vehicle or a hybrid vehicle or the like. As shown in FIGS. 2 and 3, the casing 5 includes a bottom plate portion 51 and the peripheral wall portion 52. The bottom plate portion 51 faces, from a bottom side which is one side in the height direction Z, the semiconductor modules 2, the reactor 3 and the cooling pipe 4. The peripheral wall portion 52 is provided to stand from the periphery edge of the bottom plate portion 51 towards an upper part which is the other side with respect to the height direction Z. However, the expression of upper/bottom is used for only convenience reason and does not limit a posture of the arrangement of the power conversion apparatus 1.

The abutting surface 7 is formed for each of a pair of protrusions 70 that protrude from the bottom plate portion 51 towards the upper part. As shown in FIG. 3, the pair of protrusions 70 are arranged parallel in the horizontal direction Y in plan view seen from the height direction Z. The protrusions 70 are formed integrally with the bottom plate portion 51 and the peripheral wall portion 52. In the casing 5, four bosses 511 protruding from the bottom plate portion 51 towards the upper part are provided in order to fix the reactor 3. In each of the bosses 511, a female screw portion is formed along the height direction Z. The bosses 511 are provided at both sides of respective protrusions 70 with respect to the laminate direction X. As shown in FIG. 2, the wing portion 31 is disposed between the bottom plate portion 51 and the connection pipe 412 in the component stack 12 with respect to the height direction Z.

Figure 4:
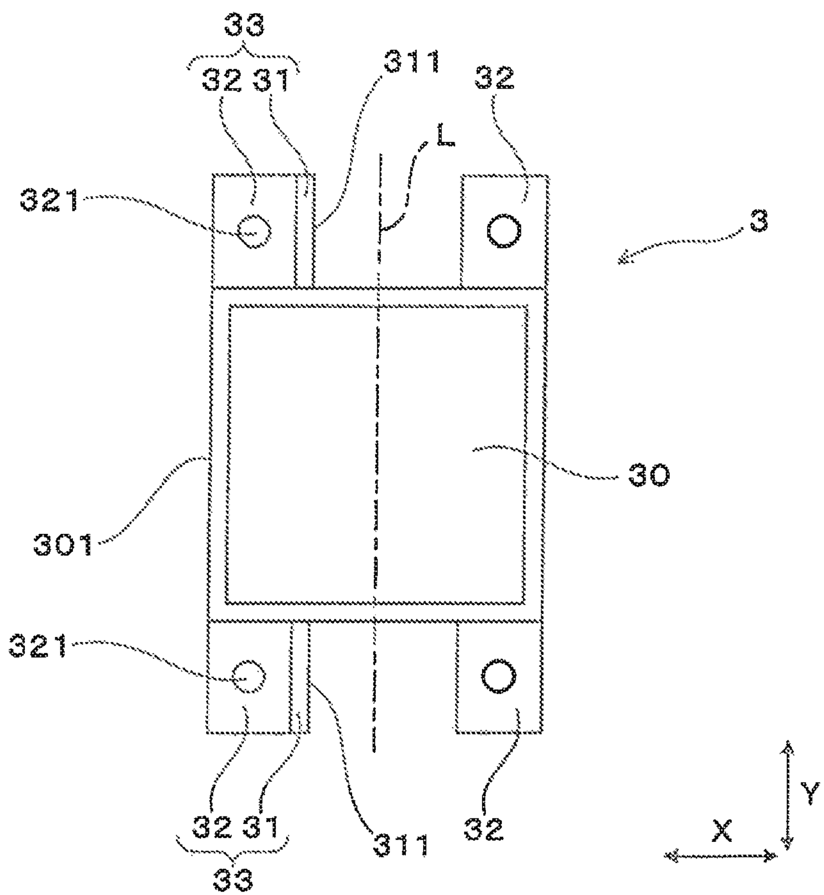
FIG. 4 is a plan view showing a reactor according to the first embodiment.
Figure 5:
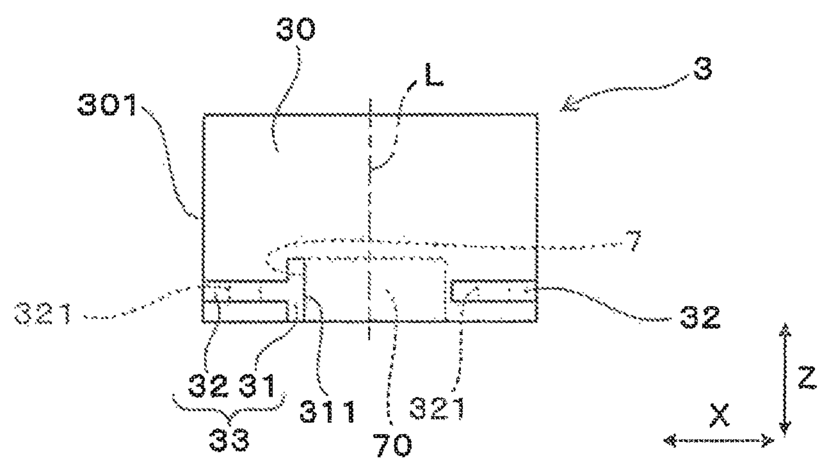
FIG. 5 is a front view showing the reactor according to the first embodiment.

As shown in FIG. 1 and FIGS. 4 to 6, the reactor 3 is configured such that flange portions 32 are provided, protruding from both sides of the reactor body 30 in the horizontal direction Y. Each of the flange portions 32 is fixed to the casing 5 using a fastening member 8. According to the first embodiment, the fastening member 8 is a bolt. As shown in FIGS. 1 and 2, each flange portion 32 is arranged such that at least a part of the flange portion 32 is disposed at a portion overlapping the connection pipes 412 of the component stack 12 in the height direction Z. As shown in FIGS. 4 and 5, the flange portion 32 is provided at two locations in the laminate direction X in the reactor body 30. The wing portion 31 is integrated to the flange portion 32 which is located most closely to the semiconductor stack 11.

In other words, the flange portion 32 is provided in the both sides of the reactor body 30 with respect to the horizontal direction Y. Further, flange portions 32 are provided at two locations in the laminate direction X in each side of the both sides. Also, the flange portion 32 is provided, in each of the both sides of the reactor body 30 with respect to the Y-direction, at both end portions with respect to the laminate direction X. Specifically, among the two flange portions 32 in each of the both sides of the reactor body 30 with respect to the Y-direction, the wing portion 31 is formed integrally to the flange portion 32 which is provided in the rear side.

A flange integrating wing portion 33 is provided in which the flange portion and the wing portion 31 are integrated. In a cross section sectioned along a line perpendicular to the horizontal direction Y, the wing portion 31 has the longitudinal side extending in the height direction Z, the flange portion 32 has the longitudinal side extending in the laminate direction X which is extended from a rear side surface opposite to the abutting surface 7 in the wing portion 31. The cross-sectional shape of the flange integrating wing portion 33 sectioned along a plane perpendicular to the horizontal direction Y is approximately a T-shape. Specifically, the flange portion 32 is formed in a plate shape having a main surface which is perpendicular to the height direction Z.

The wing portion 31 is coupled to a front end of the flange portion 32 in the rear side, and is formed in a plate-like shape provided with a major surface perpendicular to the laminate direction X. The wing portion 31 is coupled to the flange portion 32 in the middle of the height direction Z thereof. For the wing portion 31, the lower end in the height direction Z coincides the lower end of the reactor body 30. The wing portion 31 is located closer to the rear end than to the center L of the reactor 3. The wing portion 31 has a contact surface 311 that contacts with the abutting surface 7 in the laminate direction X. The contact surface 311 is a front side surface in the wing portion 31, facing the abutting surface 7. The contact surface 311 is formed in a rectangular shape when viewed from the laminate direction X.

Figure 6:
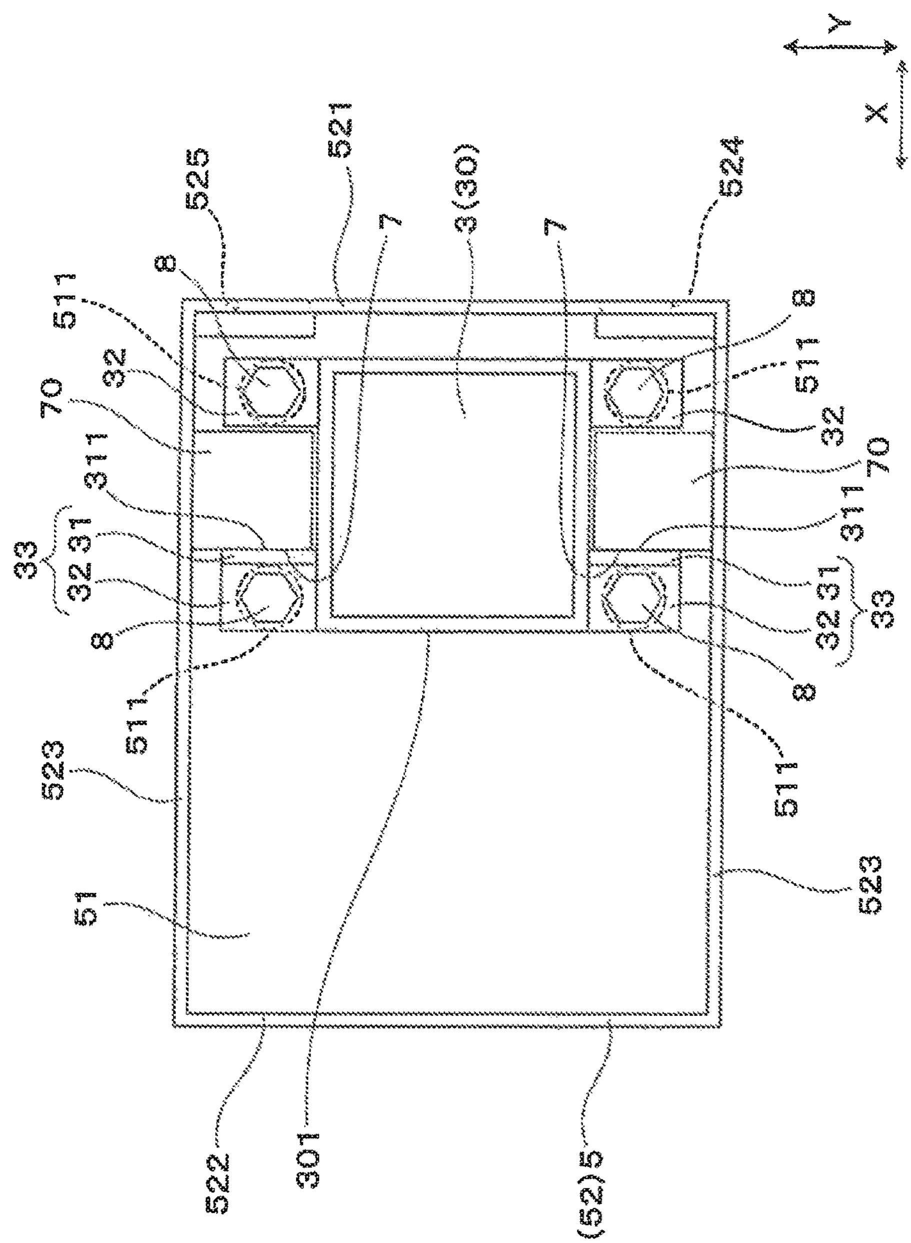
FIG. 6 is a plan view showing the reactor and the casing according to the first embodiment.

Also, the flange portion 32 is formed in a rectangular shape in plan view when viewed from the height direction Z. The length of the wing portion 31 in the horizontal direction Y is the same as the length of the flange portion 32 in the horizontal direction Y. In the flange portion 32, a insertion hole 321 to which the bolt 8 is inserted. As shown in FIG. 6, the reactor 3 is fixed to the casing 5, by inserting the bolt 8 into the insertion hole 321 and fastening the bolt 8 into the boss 511. The diameter of the insertion hole 321 is slightly larger than the shaft diameter of the bolt 8. A pair of wing portions 31 come into contact with a pair of abutting surfaces 7 (i.e., protrusions 70), respectively. The wing portion 31 according to the first embodiment comes into contact with the abutting surface 7 at a position in the reactor 3 closer to the semiconductor stack 11 with respect to the laminate direction X.

The protrusions 70 and a pair of bosses 511 are disposed in the both side of the reactor body 30 under a state where the reactor 3 is fastened and fixed to the casing 5. A gap is provided between the reactor body 30 and the protrusions 70 in the horizontal direction Y. That is, the length of the reactor body 30 in the horizontal direction Y is set to be shorter than the gap provided between the protrusions 70. Also, a gap is provided between the front side flange portion 32 and the protrusions 70 in the laminate direction X. That is, each of the protrusions 70 is formed to have a width smaller than the gap between the wing portion 31 and the front flange portion 32 in the laminate direction X. Each protrusion 70 is formed to have a length larger than a length of the wing portion 31 in the horizontal direction Y. In the height direction Z, as shown in FIG. 2, the protrusion 70 is formed to have approximately the same length as the length of the wing portion 31.

As shown in FIG. 1, a gap is formed between the reactor body 30 and the connection pipe 412 in the horizontal direction Y. Also, the length of the wing portion 31 in the horizontal direction Y is larger than the width of the connection pipe 412 in the horizontal direction Y. That is, a part of the wing portion 31 overlaps the connection pipe 412, when viewed from the height direction Z. However, in the wing portion 31, a part of the root side and a part of the protrusion side are not overlapped with the connection pipe 412.

Although illustration is omitted, the protrusion end of the wing portion 31 can be configured not to protrude outside the connection pipe 412 with respect to the horizontal direction Y. Also, entire wing portion 31 may be provided to overlap, in the height direction, the connection pipe 412 in the component stack 12. The above-described configuration can be accomplished, for example, such that no gap is provided between the reactor body 30 and the connection pipe 412 with respect to the horizontal direction Y and the length of the wing portion 31 in the horizontal direction Y is set to the width of the connection pipe 412 or less in the horizontal direction Y.

The wing portion 31 surface contacts with the abutting surface 7 of the protrusion 70 over approximately whole surface of the contact surface 311. Moreover, the flange portion 32 including the wing portion 31 is provided at a portion overlapping the abutting surface 7 when viewed from the laminate direction X. The flange portions 32, the bosses 511 and the protrusions 70 are arranged, with respect to the height direction Z, between the bottom plate portion 51 and the connection pipes 412 in the component stack 12.

Figure 7:
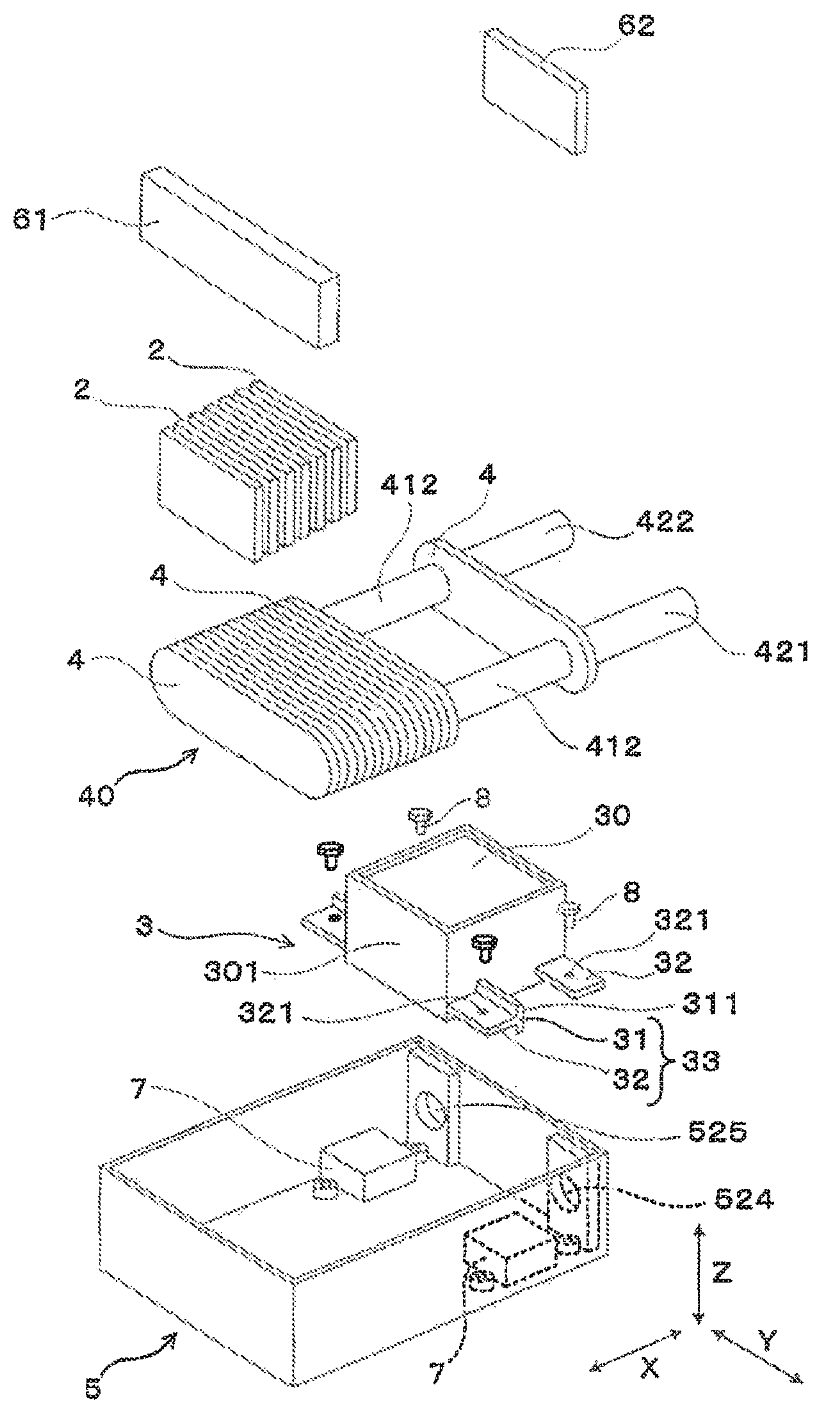
FIG. 7 is a disassembled perspective view of the power conversion apparatus according to the first embodiment.

As shown in FIGS. 1 to 2, and 7, the plurality of cooling pipes 4 are arranged in the laminate direction X as being arranged in parallel to each other. The cooling pipes 4 are configured such that coolant pass through the inside thereof, along the horizontal direction Y. The connection pipes 411 and 412 of the cooling pipes 4 may be configured using portions integrating the cooling pipes 4 or configured separately from the cooling pipes 4.

Among the plurality of cooling pipes 4, in a cooling pipe 4 disposed at one end in the laminate direction X, a coolant introducing pipe 421 and a coolant exhausting pipe 422 are provided extending in the laminate direction X. The coolant introducing pipe 421 and the coolant exhausting pipe 422 are disposed in the front side of the power conversion apparatus 1 with respect to the laminate direction X. A cooling unit 40 is configured of a plurality of cooling pipes 4, a plurality of connection pipes 411 and 412 and the coolant introducing pipe 421 and the coolant exhausting pipe 422, which are arranged and assembled together as described above. Semiconductor modules 2 and the reactor 3 are arranged between mutually adjacent cooling pipes 4 in the laminate direction X.

The reactor 3 is sandwiched between the cooling pipe 4 disposed in the front end and the cooling pipe 4 disposed second from the front end. The component stack 12 is configured of the front end cooling pipe 4 and the reactor 3. Also, the plurality of cooling pipes 4 except the front end cooling pipe 4, and the plurality of semiconductor modules 2 are stacked alternately in the laminate direction X. This part configures the semiconductor stack 11.

The plurality of cooling pipes 4 in the semiconductor stack 11 are arranged to have approximately the same intervals in the laminate direction X. On the other hand, an interval between the front end cooling pipe 4 and the cooling pipe 4 disposed second from the front end is larger than each of the intervals of the plurality of cooling pipes in the semiconductor stack 11. Hence, the connection pipe 412 in the front end has a larger length than other connection pipes 411 disposed in the rear side with respect to the laminate direction X.

The semiconductor modules 2 and the reactor 3 are configured so as to be cooled by coolant flowing through the cooling pipes 4. That is, coolant introduced into the cooling unit 40 from the coolant introducing pipe 421 is distributed into a plurality of cooling pipes 4 via the connection pipes 411 and 412, thereby circulating the coolant. Meanwhile, the coolant exchange heat with the semiconductor modules 2 or the reactor 3. The coolant that receives heat is discharged from the cooling unit 40 through the connection pipes 411 and 412, and the coolant exhausting pipe 422.

Thus, the semiconductor modules 2 and the reactor 3 are cooled.

The cooling unit 40 is configured to be capable of deformed by a pressurizing force in the laminate direction X such that the intervals between mutually adjacent cooling pipes 4 in the laminate direction X become small. For example, the connection pipes 411 and 412 can be compressively deformed in the laminate direction X, or a diaphragm structure can be provided in a joint portion between the connection pipes 411 and 412 in the cooling pipes 4. The cooling pipes 4 are made of metal having excellent thermal conductivity such as aluminum. Similarly, the connection pipes 411 and 412 that configures the cooling unit 40, the coolant introducing pipe 421 and the coolant exhausting pipe 422 are made of the same type of metal as that of the cooling pipes 4.

As shown in FIG. 3, the peripheral wall portion 52 of the casing 5 is configured of a front wall portion 521 standing from the front end of the bottom plate portion 51, a rear wall portion 522 standing from the rear end of the bottom plate portion 51, and a pair of side wall portions 523 standing from the side edges of the bottom plate portion 51. In the front wall portion 521, through holes 524 and 525 are formed, allowing the coolant introducing pipe 421 and the coolant exhausting pipe 422 to insert therethrough. The casing 5 can be made of metal such as aluminum, for example.

As shown in FIG. 1, the front wall portion 521 faces the component stack 12 from the front side. The rear wall portion 522 faces the semiconductor stack 11 from the rear side. The coolant introducing pipe 421 and the coolant exhausting pipe 422 penetrates the through holes 524 and 525 formed in the front side wall portion 521 so as to protrude towards the front side. The protrusions 70 protrude towards inside the casing 5 from the side wall portion 523.

The main pressurizing member 61 is disposed between the rear wall portion 522 and the semiconductor stack 11. The main pressurizing member 61 can be configured of a plate spring, for example. Specifically, the plate spring can be configured by bending the spring steel. Also, a pressure welded plate having high rigidity can be provided between the plate spring and the cooling pipe 4. Thus, the cooling pipes 4 can be prevented from being deformed due to localized pressurization force received from the plate spring.

The sub pressurizing member 62 is disposed in the component stack 12, at an end portion in the front side which is a far side from the semiconductor stack 11. Specifically, the sub pressurizing member 62 is provided between the front wall portion 521 and the component stack 12. The sub pressurizing member 62 may be formed of, for example, an elastic member such as rubber sheet. The sub pressurizing member 62 is disposed between the front wall portion 521 and the cooling pipe 4, as being compressive and elastic deformed.

The semiconductor modules 2 is formed by a molding such that switching elements composed of IGBTs for example are molded by resin. The IGBT is an abbreviation of insulated gate bipolar transistor. Each of the semiconductor modules 2 may be composed of a plurality of switching elements integrated thereto, or a switching element and a diode integrated thereto. Further, as shown in FIG. 7, each of the semiconductor modules 2 has a substantially rectangular parallelepiped shape in which the dimension in the laminate direction X is smaller than the dimensions of the horizontal direction Y and the height direction Z. Each of the semiconductor modules 2 has terminals (not shown) protruded in the height direction Z from a resin portion.

Figure 8:
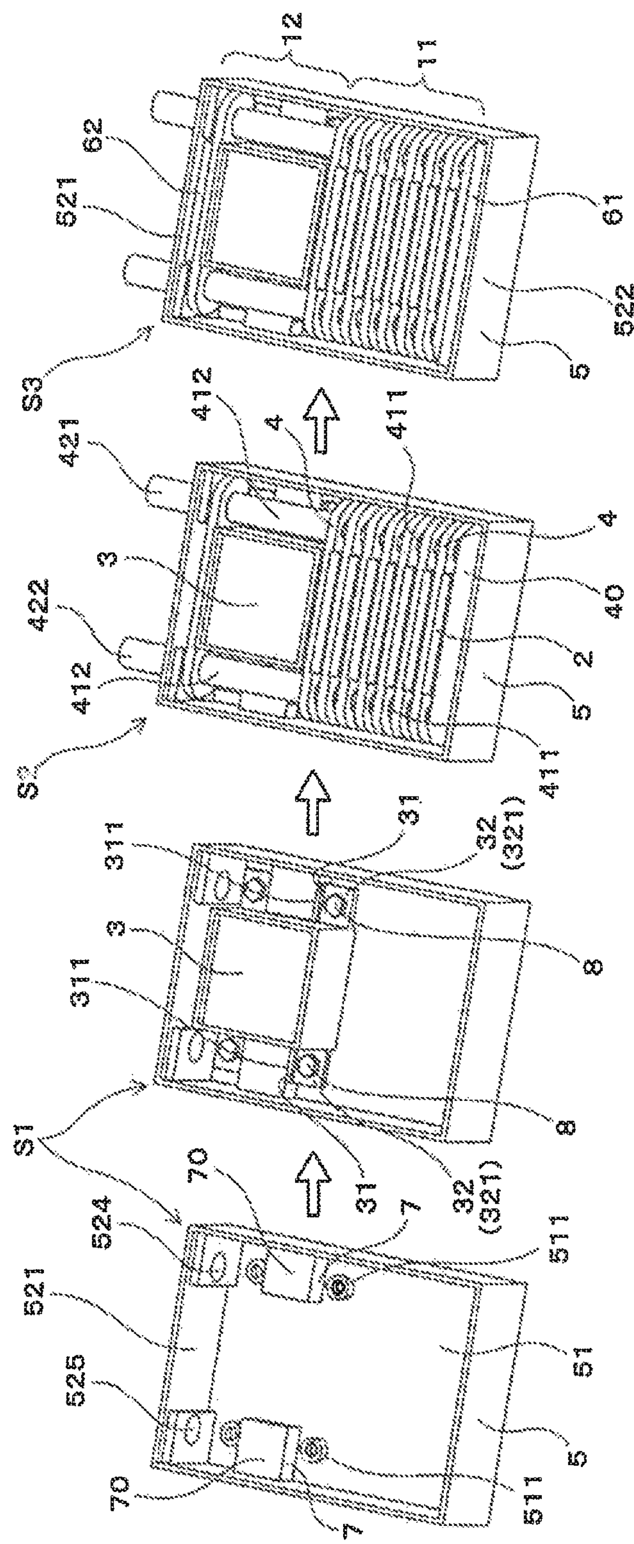
FIG. 8 is an explanatory view schematically showing a flow of manufacturing processes of the power conversion apparatus according to the first embodiment.

Next, a manufacturing method of the power conversion apparatus 1 will be described with reference to FIG. 8.

The manufacturing method of the power conversion apparatus 1 will be described with reference to FIG. 8. The manufacturing method of the power conversion apparatus 1 includes a reactor assembling process S1, a cooling unit mounting process S2, and a pressurizing member insertion process S3.

In a reactor assembling process S1, the reactor 3 is accommodated to the casing 5, while a position of the insertion holes 321 formed in the flange portion 32 of the reactor 3 and a position of a female screw portion of the boss 511 are aligned in plan view when viewed from the height direction Z. Then, the contact surface 311 of the wing portion 31 of the reactor 3 is pressed from the rear side towards the abutting surface 7 of the protrusion 70, and the bolt 8 is inserted into the insertion hole 321, followed by fastening into the boss 511 by a fastening tool.

Next, a cooling unit mounting process S2 mounts the cooling unit 40 in the casing 5. At this time, the coolant introducing pipe 421 and the coolant exhausting pipe 422 are inserted into the through holes 524 and 525. Also, the reactor body 30 which has been mounted in the casing 5 is disposed between a pair of cooling pipes 4 connected by the connection pipe 412. Then, the cooling pipe 412 is provided to cover the wing portion 31 and the flange portion 32 from an upper side with respect to the height direction Z. Moreover, the semiconductor modules 2 are arranged between the cooling pipes 4 which are connected by the connection pipes 411.

Next, a pressurizing member insertion process S3 inserts the sub pressurizing member 62 being compressed between the component stack 12 and the front wall portion 521 in the casing 5. Then, the main pressurizing member 61 being compressed is inserted between the semiconductor stack 11 and the rear end wall portion 522 of the casing 5. In this way, the power conversion apparatus 1 shown in FIG. 1 is manufactured.

Next, effects and advantages of the first embodiment will be described.

In the above-described power conversion apparatus 1, the reactor 3 has a pair of wing portions 31. The pair of wing portions 31 is protruded towards both sides in the horizontal direction Y from the reactor 30, contacting, from the rear side in the laminate direction X, the abutting surface 7 provided in a part of the casing 5. Hence, the pressurizing force of the main pressurizing member 61 that pressurizes the semiconductor stack 11 can be accepted by the abutting surface 7 of the casing 5 via the contact surface 311 of the wing portion 31. Thus, even if the pressurizing force of the main pressurizing member 61 is increased, the reactor 3 can be prevented from being displaced in the laminate direction X with respect to the casing 5. Accordingly, a contact pressure between the semiconductor modules 2 and the cooling pipes 4 in the semiconductor stack 11 can be sufficiently secured. As a result, cooling efficiency of the semiconductor module 2 can be improved.

The pressurizing force of the main pressurizing member 61 is transmitted to the reactor 30 via the semiconductor stack 11. However, the pressurizing force from the rear side only affects a portion between the rear side surface 301 of the reactor body 30 and the contact surface 311 of the wing portion 31, and the force applied to the reactor body 30 is suppressed. As a result, a withstand load of the reactor body 30 is not necessarily set to be larger, and the size of the reactor 30 is not necessarily set to be larger.

At least a part of the wing portion 31 is provided at a portion overlapping the connection pipe 412 in the component stack 12 in the height direction Z, that is, in the height direction Z, the part of the wing portion 31 is provided between the bottom plate portion 51 and the connection pipe 412 in the component stack 12. Accordingly, it is not necessary to secure a new space in the casing 5 in order to have the wing portion 31 contact the abutting surface 7 of the wing portion 31. Therefore, the power conversion apparatus 1 can be shrunk.

Also, at least a part of the flange portion 32 is arranged in a portion overlapping the connection pipe 412 in the component stack 12 in the height direction Z. Hence, it is not necessary to secure new space in the casing 5 in order to fix the reactor 3 to the casing 5. Therefore, the power conversion unit 1 can be shrunk.

The fastening direction of the bolt 8 is defined as the height direction Z. Therefore, the mountability of the reactor 3 can be enhanced. In other words, for example, assuming the fastening direction of the bolt 8 is the laminate direction X or the horizontal direction Y, the fastening member 5 may be interfered by the casing 5 when fastening the bolt 8. Hence, a mountability of the reactor 3 may be lowered. However, when the fastening direction of the bolt 8 is height the direction Z, such an inconvenience can be reduced so that the mountability can be improved.

According to the above-described power conversion apparatus 1, the flange portion 32 located closest to the semiconductor stack 11 and the wing portion 31 are integrally formed. Hence, a rigidity of the wing portion 31 against a force in the laminate direction X becomes high. Thus, the pressurizing force of the main pressurizing member 61 can be larger. Accordingly, the contact pressure between the semiconductor module 2 in the semiconductor stack 11 and the cooling pipe 4 is sufficiently secured, whereby the cooling efficiency of the semiconductor module 2 can be improved.

In the flange integrating wing portion 33, in the cross-section perpendicular to the horizontal direction Y, the wing portion 31 has a shape extending in the height direction Z, and the flange portion 32 has a shape extending in the laminate direction X extended from the rear side surface of the wing portion 31. Hence, the wing portion 31 can secure the area of the contact surface 311 and high rigidity as well.

Also, the wing portion 31 contacts the abutting surface 7 at a portion closer to the semiconductor stack 11, with respect to the laminate direction X, than the center L of the reactor 30 is. Hence, the length in the laminate direction X from the rear end surface 301 of the reactor body 30 to the contact surface 311 of the wing portion 31 is shortened so that a load applied to the reactor body 30 can be suppressed. As a result, since it is not necessary to increase the size of the reactor body 30, the size of the power conversion apparatus 1 can be small.

As described above, according to the first embodiment, a power conversion apparatus 1 can be provided, capable of improving a cooling efficiency of the semiconductor modules 2 and reducing the size of the apparatus.

Second Embodiment

Figure 9:
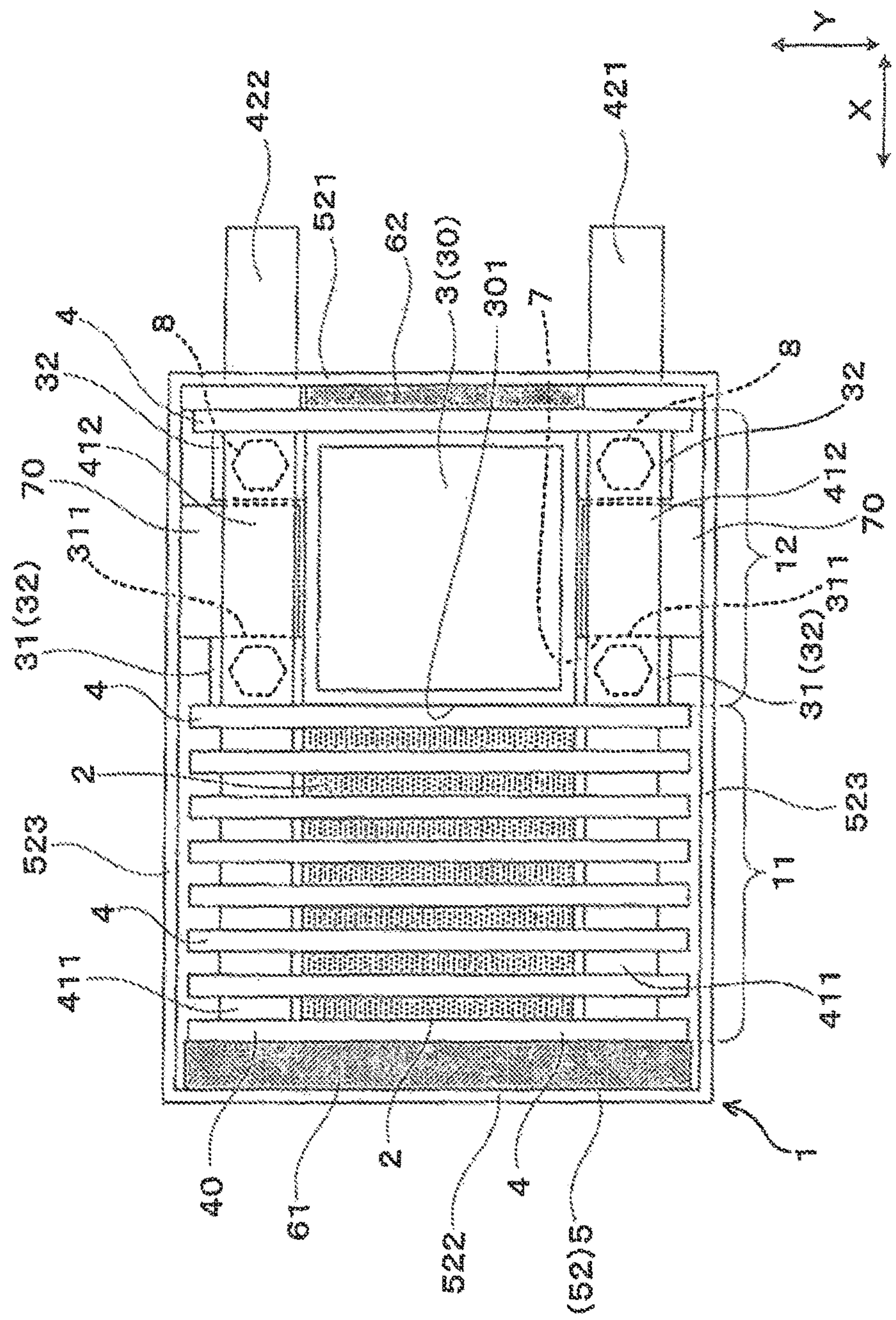
FIG. 9 is a plan view showing the power conversion apparatus according to a second embodiment.
Figure 10:
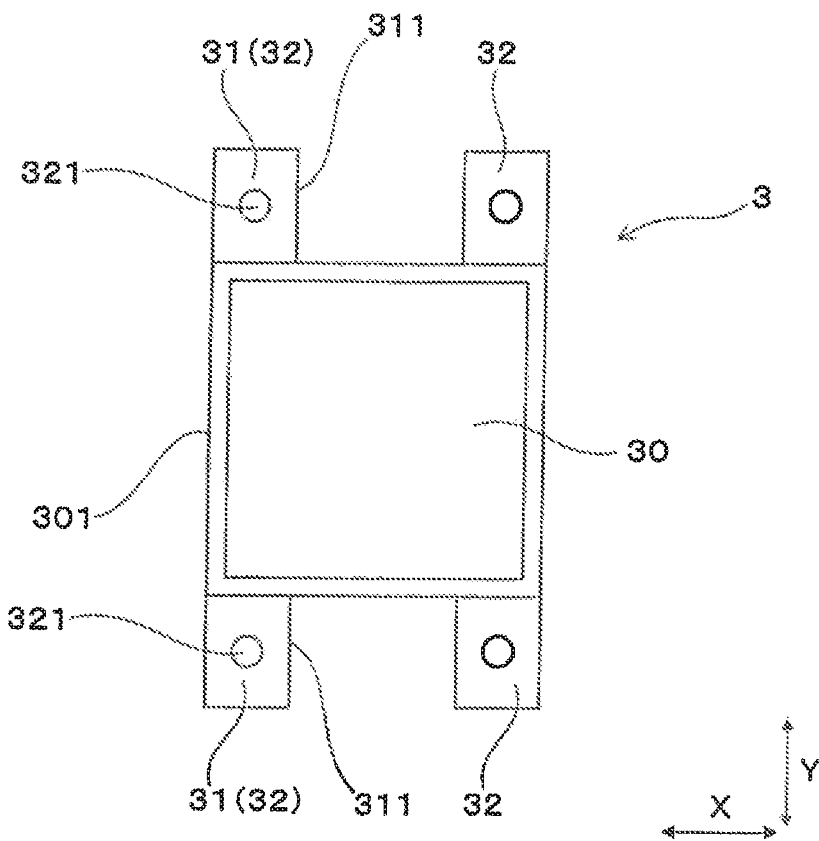
FIG. 10 is a plan view showing a reactor according to the second embodiment.
Figure 11:
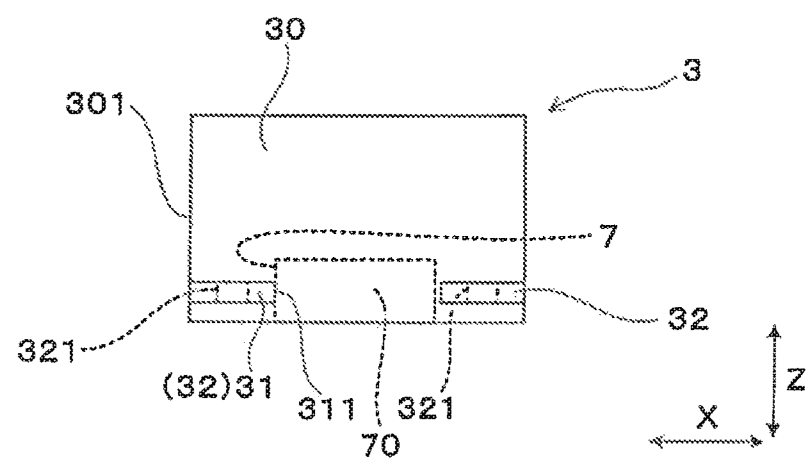
FIG. 11 is a front view showing a reactor according to the second embodiment.

According to a second embodiment, as shown in FIGS. 9 to 11, the rear end flange portion 32 serves as the wing portion 31. In other words, the front end surface of the wing portion 31 which also serves as a rear end flange portion 32 is defined as the contact surface 311. Other configurations are the same as that of the first embodiment. Among reference symbols used in the second embodiment and following embodiments, reference symbols same as that used in previously covered embodiments represent the same elements described in the previously covered embodiments, unless otherwise specified.

According to the second embodiment, the flange portion 32 in the rear end can be used as the wing portion 31. Hence, since the shape of the reactor 3 is not necessarily to be changed to special shape, a cost reduction can be achieved. Further, effects and advantages similar to the first embodiment can be obtained.

Third Embodiment

Figure 12:
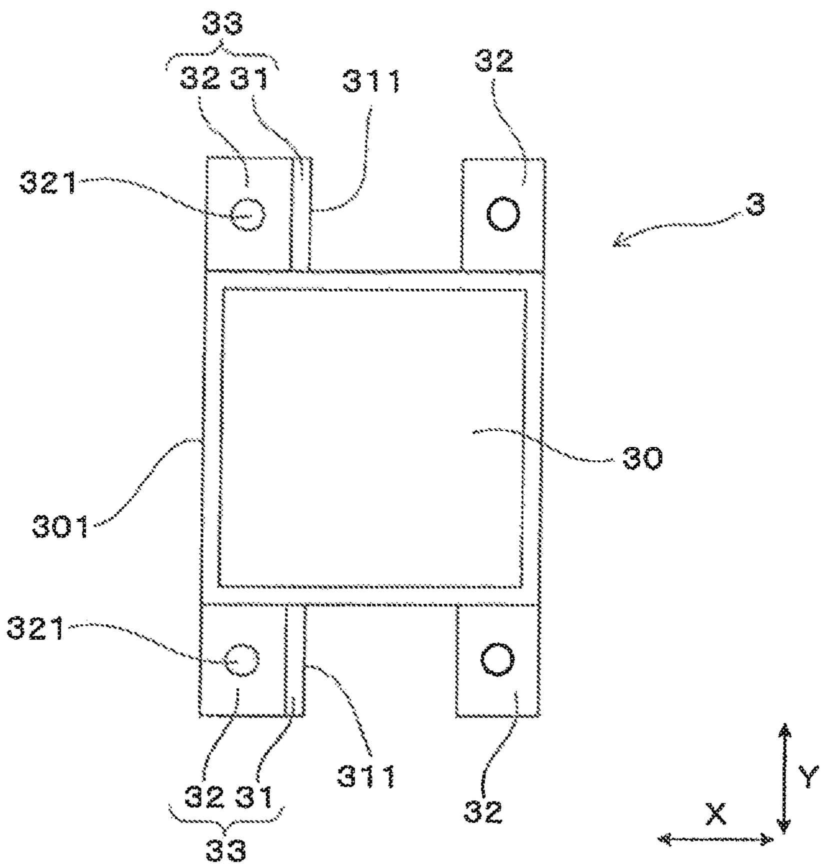
FIG. 12 is a plan view showing a reactor according to a third embodiment.
Figure 13:
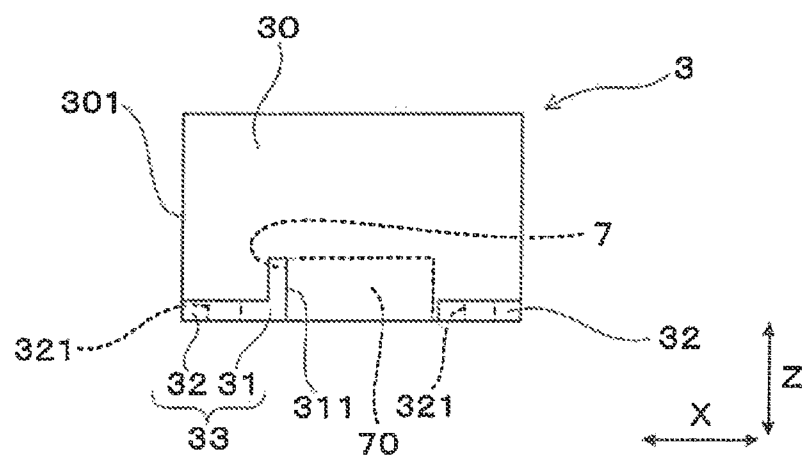
FIG. 13 is a front view showing a reactor according to the third embodiment.

According to a third embodiment, as shown in FIGS. 12 to 13, the shape of the flange integrating wing portion 33 is changed from the first embodiment. In other words, a cross-sectional shape of the flange integrating wing portion 33 sectioned along a plane perpendicular to the horizontal direction Y is approximately L shape (See FIG. 13). Specifically, the wing portion 31 is connected to the flange portion 32 at the lower end in the Z-direction. The wing portion 31 and the flange portion 32 coincides the lower end of the reactor body 30 in the Z-direction. Hence, a female screw portion is provided in the bottom plate portion 51 instead of the boss 511. The reactor 3 is fixed to the casing 5 by fastening the bolt 8 into the female screw portion.

Other configurations are similar to the first embodiment. According to the third embodiment, similar effects and advantages of the first embodiment can be obtained.

Fourth Embodiment

Figure 14:
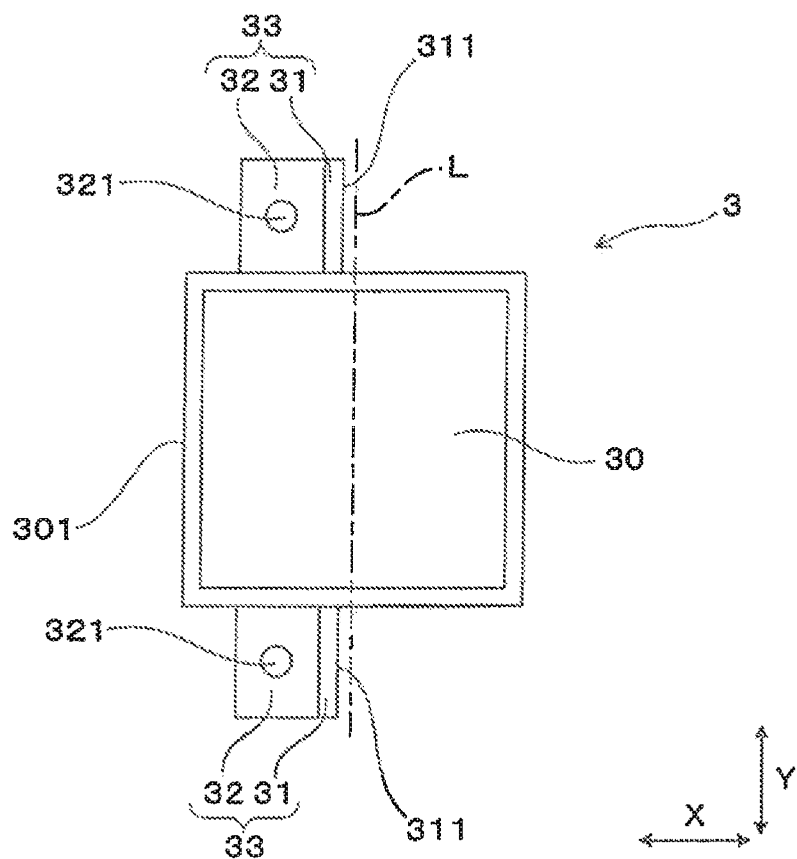
FIG. 14 is a plan view showing a reactor according to a fourth embodiment.
Figure 15:
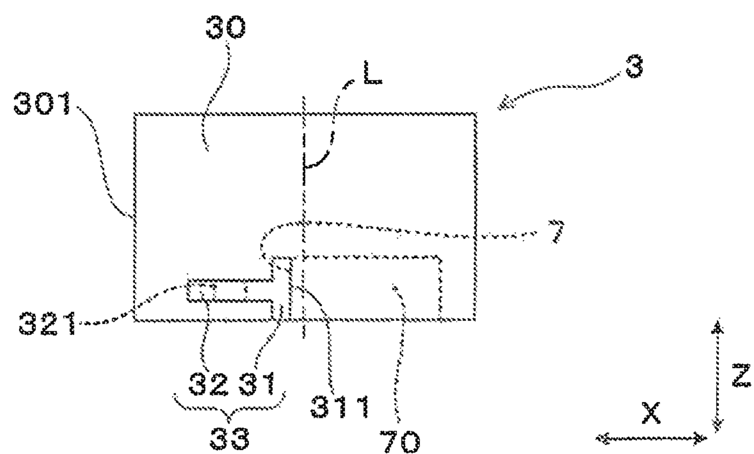
FIG. 15 is a front view showing a reactor according to the fourth embodiment.

According to the fourth embodiment, as shown in FIGS. 14 and 15, the number of flange portions 32 is changed from the first embodiment. In other words, the flange portions 32 of the fourth embodiment are provided at both sides in the horizontal direction Y of the reactor 30, in which one flange portion 32 is provided for each side in the horizontal direction Y. In other words, only one flange portion 32 is provided for each side corresponding to the same location in the X-direction. The flange portion 32 is provided, in both sides of the reactor body 30 with respect to the horizontal direction Y, closer to the center L than to the rear end in the laminate direction X. Hence, the wing portion 31 connected to the front end of the flange portion 32 is located closer to the center L in the laminate direction X. However, the location at which the wing portion 31 is disposed is closer to the rear end than to the center L with respect to the laminate direction X. Other configurations are similar to the first embodiment.

According to the fourth embodiment, the flange portions 32 are provided in the both sides in the Y-direction of the reactor body 30, in which each flange portion 32 is disposed at one location in the X-direction. Hence, the number of flange portions 32 and the number of bosses 511 provided in the bottom plate portion 51 of the casing 5 can be reduced, so that a cost reduction can be accomplished.

The location where the wing portion 31 is provided is closer to the rear end than to the center L in the X-direction. Therefore, the load of the main pressurizing member 61 applied to the reactor body 30 via the semiconductor laminate 11 can be suppressed. Moreover, similar effects and advantages to the first embodiment can be obtained.

Fifth Embodiment

Figure 16:
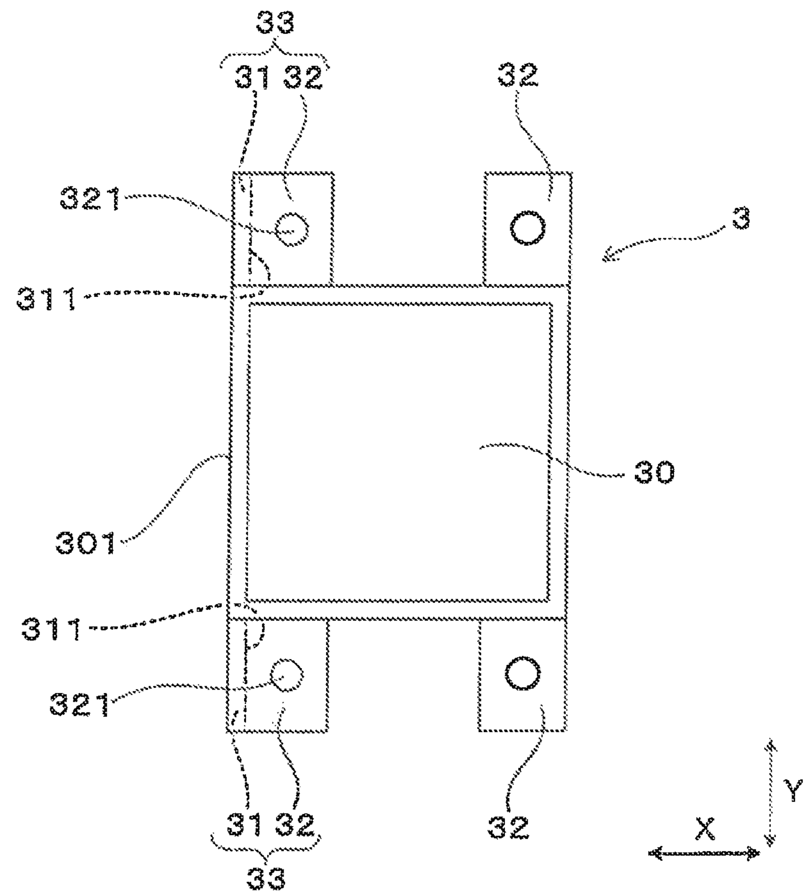
FIG. 16 is a plan view showing a reactor according to a fifth embodiment.
Figure 17:
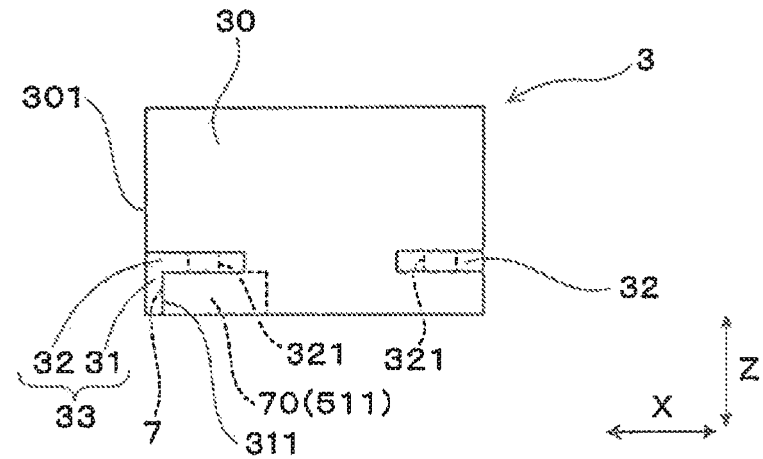
FIG. 17 is a front view showing a reactor according to the fifth embodiment.

According to a fifth embodiment, as shown in FIGS. 16 to 17, the shape of the flange integrating wing portion 33 is changed from the first embodiment. Specifically, the cross-sectional shape of the flange integrating wing portion 33, sectioned along a plane perpendicular to the horizontal direction Y is approximately L-shape. In other words, the wing portion 31 is connected to the rear end of the rear side flange portion 32 and formed in a plate shape provided with a plane perpendicular to the laminate direction X. The wing portion 31 is connected to the flange portion 32 at the upper end in the Z-direction. Hence, the protrusion 70 is disposed close to the rear end of the reactor 3 in the laminate direction X. According to the fifth embodiment, the boss 511 provided in the rear side of the bottom plate portion 51 in the casing 5 is used as the protrusion 70. In other words, the rear end surface of the protrusion 70 which also serves as the rear side boss 511 is the abutting surface 7. Other configurations are similar to that of the first embodiment.

According to the fifth embodiment, the wing portion 31 is connected to the rear end of the rear side flange portion 32, and formed in a plate shape provided with a plane perpendicular to the laminate direction X. Accordingly, a portion between the rear side surface 301 and the wing portion 31 in the reactor body 30 with respect to the laminate direction X can be smaller so that the load applied to the reactor body 30 can be further suppressed. Thus, since the withstand load of the reactor body 30 becomes smaller, the size of the reactor body 30 can be smaller. As a result, the size of the power conversion apparatus 1 can be further shrunk. Moreover, similar effects and advantages to the first embodiment can be obtained.

Sixth Embodiment

Figure 18:
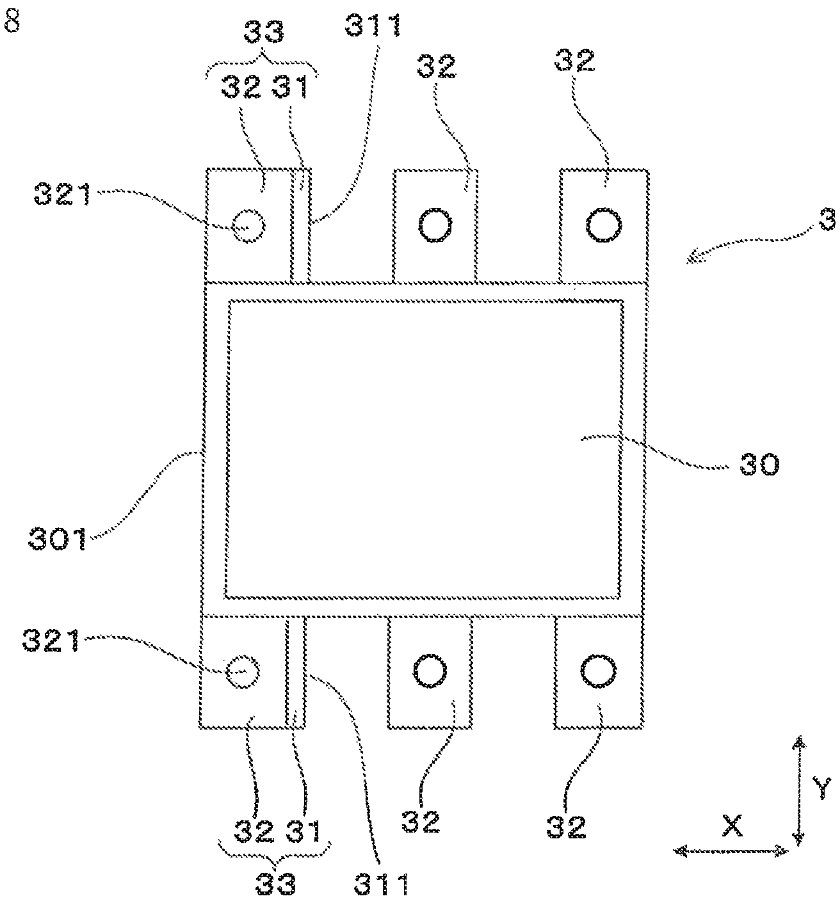
FIG. 18 is a plan view showing a reactor according to a sixth embodiment.
Figure 19:
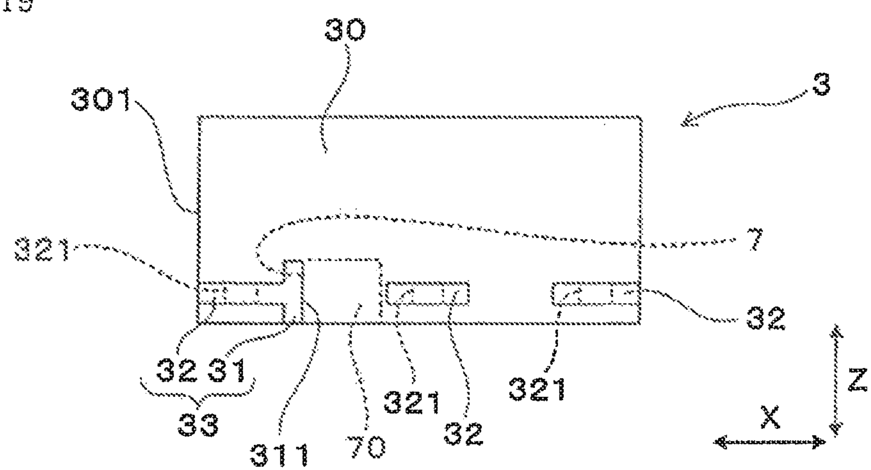
FIG. 19 is a front view showing a reactor according to the sixth embodiment.

According to the sixth embodiment, as shown in FIGS. 18 to 19, the number of flange portions 32 is changed from the first embodiment. In other words, the flange portions 32 are provided at three locations in the reactor 3 in the laminate direction X. The flange portions 32 are provided at both ends in the X-direction in the both sides of the reactor body 30 in the horizontal direction Y, and provided at the center in the laminate direction X in the both sides of the reactor body 30 in the horizontal direction Y. Hence, six bosses 511 are provided in the bottom plate portion 51 of the casing 5.

The wing portion 31 is integrally formed with the flange portion 32 provided at the rear end among three flange portions 32 disposed at respective both side surfaces of the reactor 30 in the horizontal direction Y. The protrusions 70 of the casing 5 are arranged between the rear end flange portion 32 and the center flange portion 32 in the laminate direction X. The contact surface 311 of the wing portion 31 comes into contact with the abutting surface 7 which is a rear surface of the protrusion 70. Other configurations are similar to that of the first embodiment.

According to the sixth embodiment, three flange portions 32 are provided at corresponding three locations in the laminate direction X of the reactor body 30. Therefore, the reactor 3 is fixed to the casing 5 by the six bolts 8, whereby anti-vibration properties of the power conversion apparatus 1 can be improved. Moreover, similar effects and advantages to the first embodiment can be obtained.

Seventh Embodiment

Figure 20:
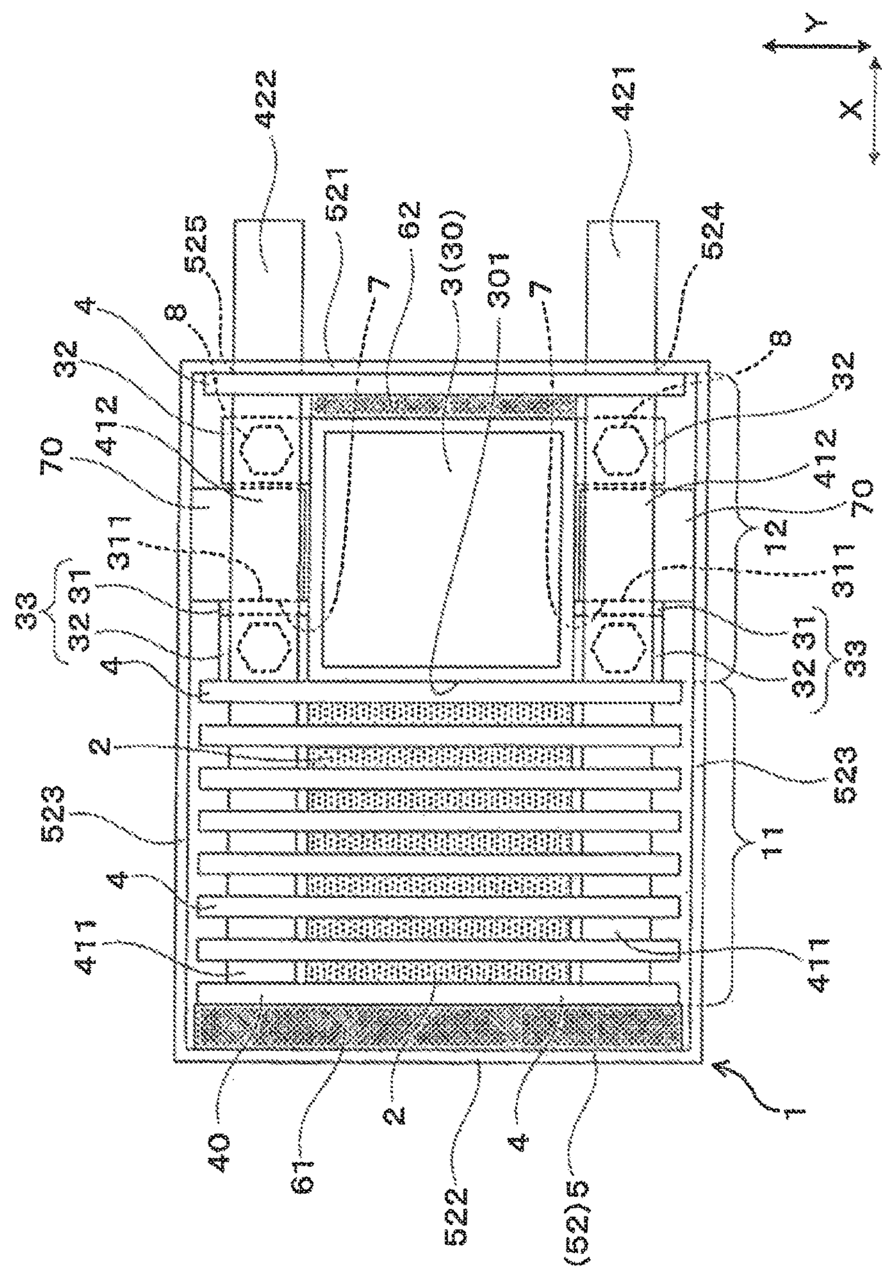
FIG. 20 is a plan view showing a power conversion apparatus according to a seventh embodiment.

According to a seventh embodiment, as shown in FIG. 20, the power conversion apparatus 1 is configured such that the sub pressurizing member 62 is disposed between the cooling pipe 4 and the reactor 3.

According to the seventh embodiment, the sub pressurizing member 62 has thermal conductivity. As the sub pressurizing member 62 having thermal conductivity, a silicone resin sheet containing thermally conductive filler can be used.

The power conversion apparatus 1 according to the seventh embodiment is configured such that the component stack 12 is pressurized from a portion between the reactor 3 and the cooling pipe 4 which are laminated to each other, to the outside the component stack 12 in the laminate direction X. Thus, the cooling pipe 4 disposed in the front side of the sub pressurizing member 62 is pressed towards the front wall portion 521, and the surface 301 of the semiconductor stack 11 side of the reactor 3 provided in the rear side of the sub pressurizing member 62 is pressed towards the semiconductor stack 11. The sub pressurizing member 62 in a state of being elastically compressed is pressure-contacted with both of the reactor 3 and the cooling pipe 4.

Thus, the sub pressurizing member 62 having the thermal conductivity is pressure-contacted with both of the reactor 3 and the cooling unit 4, thereby reducing the thermal resistance between the reactor 3 and the cooling unit 4. Thus, the reactor 3 can be effectively cooled by the cooling pipes 4. Other configuration and effects and advantages are similar to that of the first embodiment.

The present disclosure is not limited to the above-described embodiments. However, various embodiments can be configured without departing the scope of the invention. In the above-described embodiments, as an electronic component, a reactor is provided as an example. However, it is not limited to this component, but other components such as a capacitor or a DC-DC converter can be used. In the above-described embodiments, as an example, the wing portion 31 and the flange portion 32 are integrated. However, it is not limited thereto. For example, the wing portion 31 and the flange portion 32 can be provided separately.

What is claimed is:

1. A power conversion apparatus comprising:

a semiconductor module that integrates a semiconductor element;

an electronic component electrically connected to the semiconductor module;

a plurality of cooling pipes that cool the semiconductor module and the electronic component, the cooling pipes being disposed to sandwich both sides of the semiconductor module and the electronic component;

a casing that accommodates the semiconductor module, the electronic component and the cooling pipes, an abutting surface being provided at a part of the casing, wherein the electronic component comes into contact with the abutting surface;

a semiconductor section including the semiconductor module and the cooling pipes arranged therein;

an electronic component section including the electronic component and the cooling pipes; and a pressurizing member that pressurizes the semiconductor section in a first direction, the first direction extending from the semiconductor module to the electronic component section, wherein the semiconductor section and the electronic component section are arranged to be adjacent to each other;

the electronic component includes a part body and a wing portion; and the wing portion protrudes from the part body at either one side or both sides thereof with respect to a second direction as a horizontal direction which is perpendicular to the first direction, and the wing portion has a surface facing the abutting surface in the first direction, and the surface of the wing portion and the abutting surface are in contact with each other, wherein the casing includes a bottom plate portion and a peripheral wall portion;

the bottom plate portion faces, from a bottom side which is one side in a third direction, the semiconductor module, the electronic component and the cooling pipes;

the peripheral wall portion stands from a periphery edge of the bottom plate portion towards an upper part which is the other side with respect to the third direction;

the abutting surface is formed on a protrusion protruding from the bottom plate portion towards an upper part with respect to the third direction; and the wing portion is disposed between the bottom plate portion and the connection pipe in the electronic component section with respect to the third direction.

2. The power conversion apparatus according to claim 1, wherein the cooling pipes has a shape of which a longitudinal side extends in the second direction;

the apparatus further includes a connection pipe that connects the cooling pipes adjacently located in the first direction at both ends of the cooling pipes with respect to the second direction;

at least a part of the wing portion is located at a portion overlapping the connection pipe, in the electronic component section, with respect to the third direction as a height direction perpendicular to both of the first and second directions.

3. The power conversion apparatus according to claim 1, wherein the wing portion contacts the abutting surface at a portion, with respect to the first direction, closer to the semiconductor section than a center of the electronic component section is.

4. A power conversion apparatus comprising:

a semiconductor module that integrates a semiconductor element;

an electronic component electrically connected to the semiconductor module;

a plurality of cooling pipes that cool the semiconductor module and the electronic component, the cooling pipes being disposed to sandwich both sides of the semiconductor module and the electronic component;

a casing that accommodates the semiconductor module, the electronic component and the cooling pipes, an abutting surface being provided at a part of the casing, wherein the electronic component comes into contact with the abutting surface;

a semiconductor section including the semiconductor module and the cooling pipes arranged therein;

an electronic component section including the electronic component and the cooling pipes; and a pressurizing member that pressurizes the semiconductor section in a first direction, the first direction extending from the semiconductor module to the electronic component section, wherein the semiconductor section and the electronic component section are arranged to be adjacent to each other;

the electronic component includes a part body and a wing portion; and the wing portion protrudes from the part body at either one side or both sides thereof with respect to a second direction as a horizontal direction which is perpendicular to the first direction, and the wing portion has a surface facing the abutting surface in the first direction, and the surface of the wing portion and the abutting surface are in contact with each other, wherein the electronic component is configured to include a flange portion protruding from both sides of the part body in the second direction;

the flange portion is fixed to the casing by a fastening member; and at least a part of the flange portion is located at a portion overlapping the connection pipe, in the electronic part portion, with respect to a third direction.

5. The power conversion apparatus according to claim 4, wherein a fastening direction of the fastening member is defined as the third direction.

6. The power conversion apparatus according to claim 4, wherein at least one of the flange portions and the wing portion are integrally formed.

7. The power conversion apparatus according to claim 6, wherein the flange portion is provided at a plurality of locations of the part body along the first direction; and the wing portion is integrated to the flange portion which is located most closely to the semiconductor section, thereby forming a flange integrated portion.

8. The power conversion apparatus according to claim 6, wherein the flange integrated portion is configured such that, in a cross section sectioned along a line perpendicular to the second direction, the wing portion has the longitudinal side extending in the third direction; and the flange portion has the longitudinal side extending in the first direction which is extended from a surface opposite to the abutting surface in the wing portion.

* * * * *

UNITED STATES PATENT AND TRADEMARK OFFICE

CERTIFICATE OF CORRECTION

PATENT NO. : 10,512,199 B2
APPLICATION NO. : 15/695825
DATED : December 17, 2019
INVENTOR(S) : Naoki Hirasawa et al.

It is certified that error appears in the above-identified patent and that said Letters Patent is hereby corrected as shown below:

On the Title Page

Change item (72) to:
(72) Inventors: Naoki Hirasawa, Nishio (JP); Ryota Tanabe, Kariya (JP); Takashi Kawashima, Kariya (JP); Takashi Yanbe, Sendai (JP); Masahiro Kondou, Sendai (JP)

Signed and Sealed this
Third Day of March, 2020

Andrei Iancu
*Director of the United States Patent and Trademark Office*